(12) United States Patent
Tatemi et al.

(10) Patent No.: US 11,249,137 B2
(45) Date of Patent: Feb. 15, 2022

(54) DIAGNOSTIC METHOD OF SWITCHGEAR AND DEVICE THEREOF

(71) Applicant: Hitachi, Ltd., Tokyo (JP)

(72) Inventors: Masaru Tatemi, Tokyo (JP); Toshiaki Rokunohe, Tokyo (JP); Masanori Otsuki, Tokyo (JP); Akira Takahama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/872,585

(22) Filed: May 12, 2020

(65) Prior Publication Data

US 2020/0363473 A1     Nov. 19, 2020

(30) Foreign Application Priority Data

May 16, 2019   (JP) .............................. JP2019-092765

(51) Int. Cl.
*G01R 31/327*     (2006.01)
*G01P 15/00*      (2006.01)

(52) U.S. Cl.
CPC ....... *G01R 31/3275* (2013.01); *G01R 31/327* (2013.01); *G01R 31/3274* (2013.01); *G01P 15/00* (2013.01)

(58) Field of Classification Search
CPC ... G01P 15/00; G01R 31/327; G01R 31/3274; G01R 31/3275; G05B 23/0221; G06F 11/22

(Continued)

(56) References Cited

U.S. PATENT DOCUMENTS

| 4,975,800 A | * | 12/1990 | Oshita | ................ | G01R 31/3274 324/520 |
| 5,305,235 A | * | 4/1994 | Izui | ........................ | G06F 11/22 702/185 |

(Continued)

FOREIGN PATENT DOCUMENTS

| CN | 107450017 A | 12/2017 |
| CN | 207148285 U | 3/2018 |

(Continued)

OTHER PUBLICATIONS

Extended European Search Report issued in European Application No. 20171369.0 dated Oct. 14, 2020 (11 pages).

(Continued)

*Primary Examiner* — John H Le
(74) *Attorney, Agent, or Firm* — Crowell & Moring LLP

(57) ABSTRACT

A diagnostic method of switchgear and a device of switchgear that allow regularly grasping a state with high accuracy with a simple configuration is provided. The diagnostic method of switchgear includes: obtaining signals from an acceleration sensor mounted to a switchgear and a load current flowing through the switchgear; determining a frequency to be focused from a spectrum analysis result of the signals from the acceleration sensor in an advance preparation phase of diagnosis of the switchgear, generating learning data using at least the frequency and the load current as feature values; and regularly diagnosing the state of the switchgear from the feature values obtained during diagnosis and the learning data during the diagnosis of the switchgear.

7 Claims, 7 Drawing Sheets

(58) Field of Classification Search
USPC .................................................. 702/57, 183
See application file for complete search history.

(56) References Cited

U.S. PATENT DOCUMENTS 5,419,197 A * 5/1995 Ogi .................... G05B 23/0221
702/141
2010/0169030 A1 7/2010 Parlos

FOREIGN PATENT DOCUMENTS

| CN | 108152726 A | 6/2018 |
| CN | 105703258 B | 1/2019 |
| CN | 109425826 A | 3/2019 |
| JP | 2002-367492 A | 12/2002 |
| JP | 2011-103230 A | 5/2011 |
| KR | 10-1865086 B1 | 6/2018 |

OTHER PUBLICATIONS

Ogi et al., "Fault Diagnosis of Gas Insulated Switchgear Using Adaptive Neural Networks," Sep. 5, 1993, pp. 49-56, vol. 1, XP010278981 (8 pages).

* cited by examiner

| SAMPLE No. | FEATURE VALUE | | | | | | |
|---|---|---|---|---|---|---|---|
| | CURRENT (A) | VOLTAGE (V) | SPECTRUM VALUE OF f(1)(Hz) | SPECTRUM VALUE OF f(2)(Hz) | ... | SPECTRUM VALUE OF f(N-2)(Hz) | |
| 1 | ○○ | ○○ | ○○ | ○○ | ... | ○○ | |
| 2 | ○○ | ○○ | ○○ | ○○ | ... | ○○ | |
| ... | ... | ... | ... | ... | ... | ... | |
| N | ○○ | ○○ | ○○ | ○○ | ... | ○○ | |
| ... | ... | ... | ... | ... | ... | ... | |
| Nsm | ○○ | ○○ | ○○ | ○○ | ... | ○○ | |

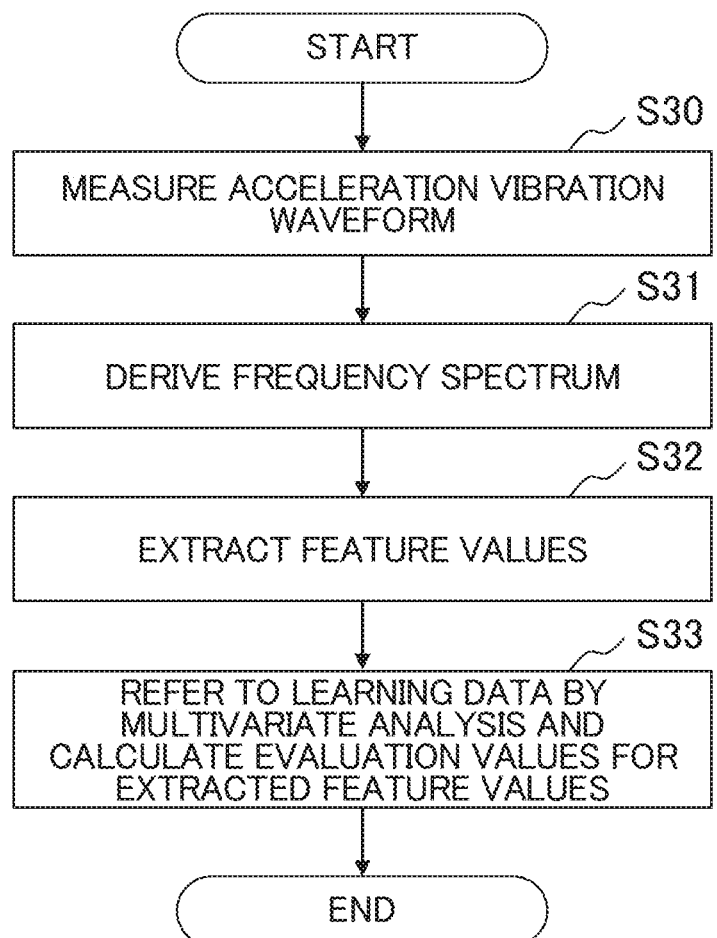

DIAGNOSTIC METHOD OF SWITCHGEAR AND DEVICE THEREOF

CLAIM OF PRIORITY

The present application claims priority from Japanese Patent application serial no. 2019-092765, filed on May 16, 2019, the content of which is hereby incorporated by reference into this application.

BACKGROUND

The present invention relates to a diagnostic method of switchgear and a device thereof that diagnose a state of a switchgear.

A high-voltage facility installed in an electric power station, such as an electrical substation, has been requested to be highly reliable. Especially, a switchgear has an important role of cutting off an accident current to protect a device of a load. Once the switchgear breaks down, an influence due to a power failure is large, and its repair takes time.

Therefore, in order to confirm and maintain performance of a switchgear, such as a breaker, periodic inspection, such as inspection on a switching operation time and the like, has been performed. However, for periodic inspection, it is necessary to cut off an electric circuit and stop the operation. Accordingly, inspection frequency has a limitation, and the inspection is generally performed at a cycle, such as three years or six years.

In contrast to this, to obtain higher reliability, a diagnostic technique that allows monitoring a state of the switchgear, such as a breaker, in an operating state has been proposed.

In Japanese Unexamined Patent Application Publication No. 2011-103230, an acceleration sensor is mounted to a breaker to measure a vibration waveform at the time of switching, calculate a coefficient of correlation with an initial vibration waveform, and evaluate a state of the breaker.

In Japanese Unexamined Patent Application Publication No. 2002-367492, an acceleration sensor and a vibration exciter are mounted to a breaker and a casing of the breaker is vibrated by the vibration exciter to measure a vibration waveform and evaluate a difference from a resonance point of the spectrum in normal to detect looseness of a bolt, which becomes a cause of a damage accident.

SUMMARY

In Japanese Unexamined Patent Application Publication No. 2011-103230, to obtain the vibration waveform, a switching operation of the breaker needs to be waited. Therefore, with a breaker of low switching frequency, a frequency that the state can be diagnosed is low and therefore regularly grasping the state has been difficult.

In Japanese Unexamined Patent Application Publication No. 2002-367492, mounting the vibration exciter to the breaker is also necessary to obtain the vibration waveform, thereby having a problem in reliability.

Accordingly, an object of the present invention is to provide a diagnostic method of switchgear and a device thereof that allow regularly grasping a state with high accuracy with a simple configuration.

A diagnostic method of switchgear according to the present invention includes: obtaining signals from an acceleration sensor mounted to a switchgear and a load current flowing through the switchgear; determining a frequency to be focused from a spectrum analysis result of the signals from the acceleration sensor in an advance preparation phase of diagnosis of the switchgear, generating learning data using at least the frequency and the load current as feature values; and regularly diagnosing a state of the switchgear from the feature values obtained during diagnosis and the learning data during the diagnosis of the switchgear.

A diagnostic device of switchgear according to the present invention includes an input unit, a learning data database, and a state estimator. The input unit is configured to obtain signals from an acceleration sensor mounted to a switchgear and a load current flowing through the switchgear. The learning data database is configured to store learning data. The learning data is generated by determining a frequency to be focused from a spectrum analysis result of the signals from the acceleration sensor in an advance preparation phase of diagnosis of the switchgear and using at least the frequency and the load current as feature values. The state estimator is configured to regularly diagnose a state of the switchgear from the feature values obtained during diagnosis and the learning data during the diagnosis of the switchgear.

With the present invention, a diagnostic method of switchgear and a device thereof that allow regularly grasping a state with high accuracy with a simple configuration can be provided.

BRIEF DESCRIPTION OF THE DRAWINGS

FIG. 13 is a drawing illustrating a process in a diagnostic phase among the internal processes in the state estimator 5.

DETAILED DESCRIPTION

Embodiments of the present invention will be described with reference to the drawings.

Embodiments

The present invention features that a state of a switchgear, that is, presence/absence of abnormality is estimated with high accuracy without a wait for switching operation.

Figure 1:
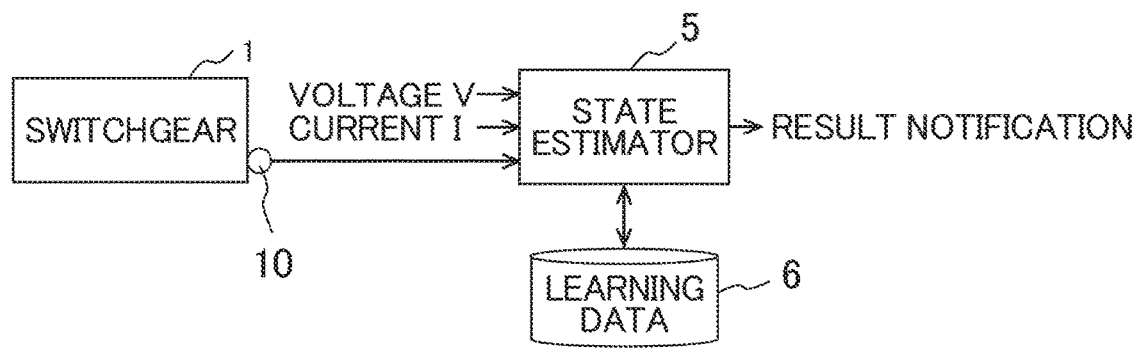
FIG. 1 is a drawing illustrating a basic configuration example of a diagnostic device of switchgear according to an embodiment of the present invention.

FIG. 1 illustrates a basic configuration example of a diagnostic device of switchgear according to the embodiment of the present invention. The diagnostic device of the present invention includes an acceleration sensor 10 mounted to a switchgear 1 as a diagnostic target, a state estimator 5, and a learning data database 6. A plurality of the acceleration sensors 10 may be mounted. In addition to an acceleration vibration waveform from the acceleration sensor 10, a current I (load current) fed to the switchgear 1 and a voltage V (applied voltage) are input to the state estimator 5.

Figure 2:
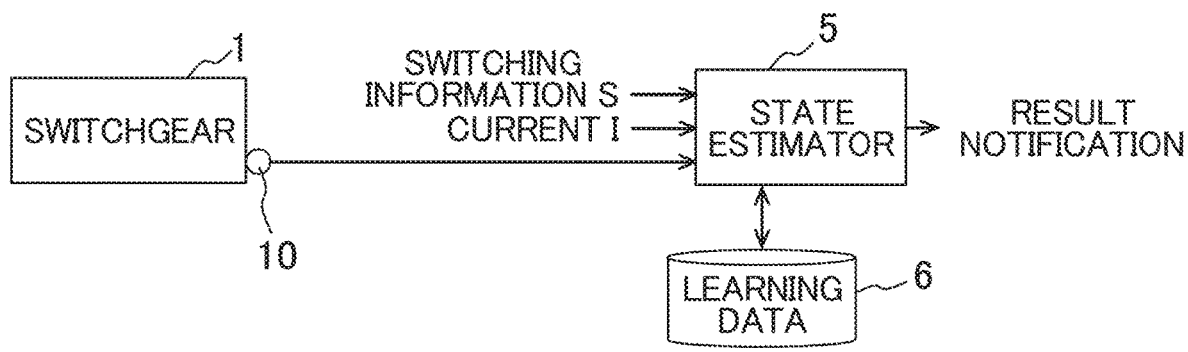
FIG. 2 is a drawing illustrating another basic configuration example of the diagnostic device of switchgear according to the embodiment of the present invention.

FIG. 2 illustrates another basic configuration example of the diagnostic device of switchgear according to the embodiment of the present invention. In the configuration of FIG. 1, information on the voltage V (applied voltage) input to the state estimator 5 is usually maintained to be constant. Accordingly, its magnitude is of small importance. If anything, since it is only necessary that whether the voltage is applied or not can be determined, the information is substitution for switching information S on a switch contact point.

Figure 3:
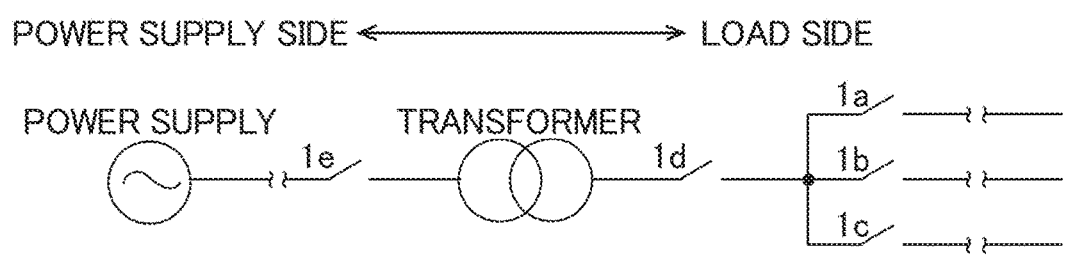
FIG. 3 is a drawing illustrating an example of the switchgear to which the present invention is applied.

FIG. 3 illustrates an example of the switchgear 1 to which the present invention is applied. For example, a power supply-side breaker 1e and a load-side breaker 1d of a transformer coupled to a bus bar in an electrical substation, and further breakers 1a, 1b, and 1c of power-transmission lines branched from the bus bar of the electrical substation, and the like are targets for application. Although not illustrated, various disconnectors can be application targets of the present invention.

In FIG. 1 and FIG. 2, the state estimator 5 calculates a degree of match with the input based on learning with learning data stored in a learning data database 6 representative of the input state in normal and notifies (result notification) the evaluation result equivalent to an amount of deviation from the normal state. The smaller evaluation result means that the input matches the pattern in normal, and the larger evaluation result means that a degree of deterioration increases.

Figure 4:
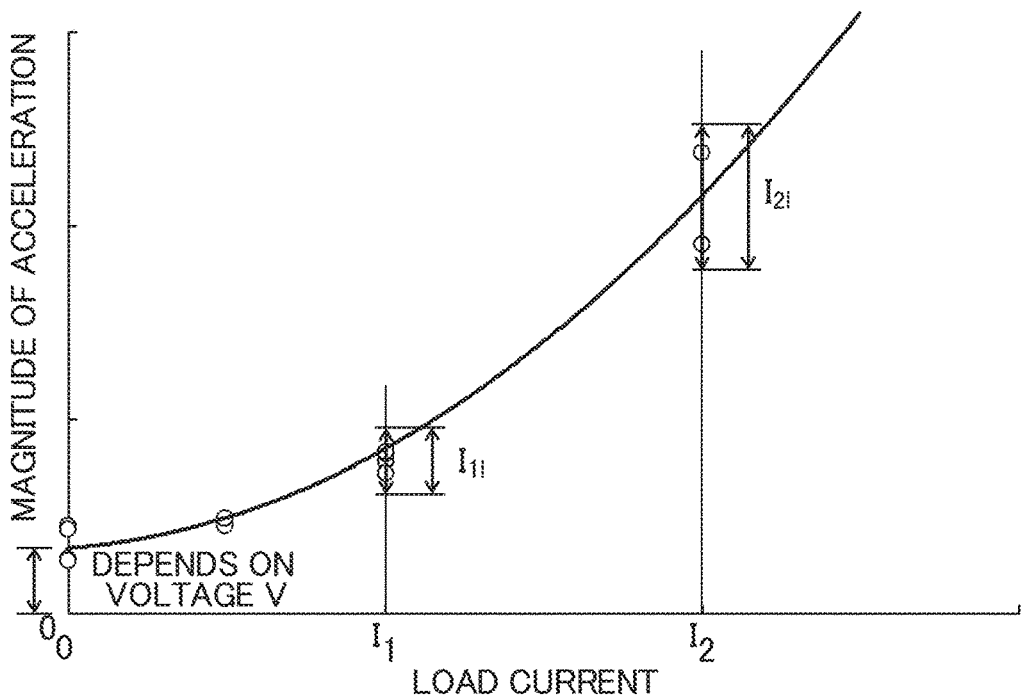
FIG. 4 is a drawing illustrating a relationship between a load current and a magnitude of acceleration.

The present invention focuses that the current I and the voltage V generate electromagnetic force and electrostatic force, respectively, to serve as vibration sources to the switchgear 1. FIG. 4 is a drawing illustrating a relationship between the load current (horizontal axis) and the magnitude of the acceleration (vertical axis) and illustrates a result of actually measuring the magnitude of the acceleration relative to the load current. As illustrated in the drawing, the magnitude of the acceleration increases by a square of the load current. Additionally, the acceleration at the load current of 0 (A) is considered to be a sum of a noise component and the electrostatic force generated by voltage. That is, the magnitude of the acceleration depends on the current I and the voltage V. Based on the knowledge, considering the magnitudes of the current I and the voltage V, states in normal and in abnormality are highly sensitively identifiable from the acceleration vibration waveform that is regularly measured.

For example, at a load current $I_1$ or $I_2$, when acceleration large relative to a range of the magnitude of the acceleration measurable during a usual operation (for example, $I_{11}$ at $I_1$ or $I_{21}$ at $I_2$) is detected, the switchgear 1 can be determined as abnormal.

Additionally, a state in which the measured acceleration has a value departed from a threshold is continuously observed sometimes due to progress of deterioration with, for example, progress of an operating period of the switchgear 1 progresses. The value is usually in a predetermined range according to the current I.

Figure 5:
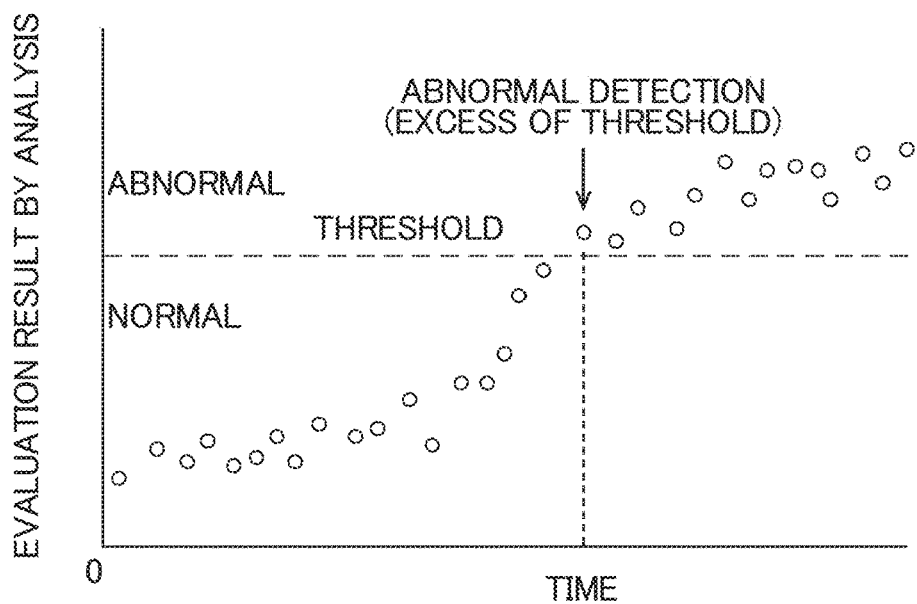
FIG. 5 is a drawing illustrating an example of determining abnormality from a secular change in magnitude of observed acceleration.
Figure 6:
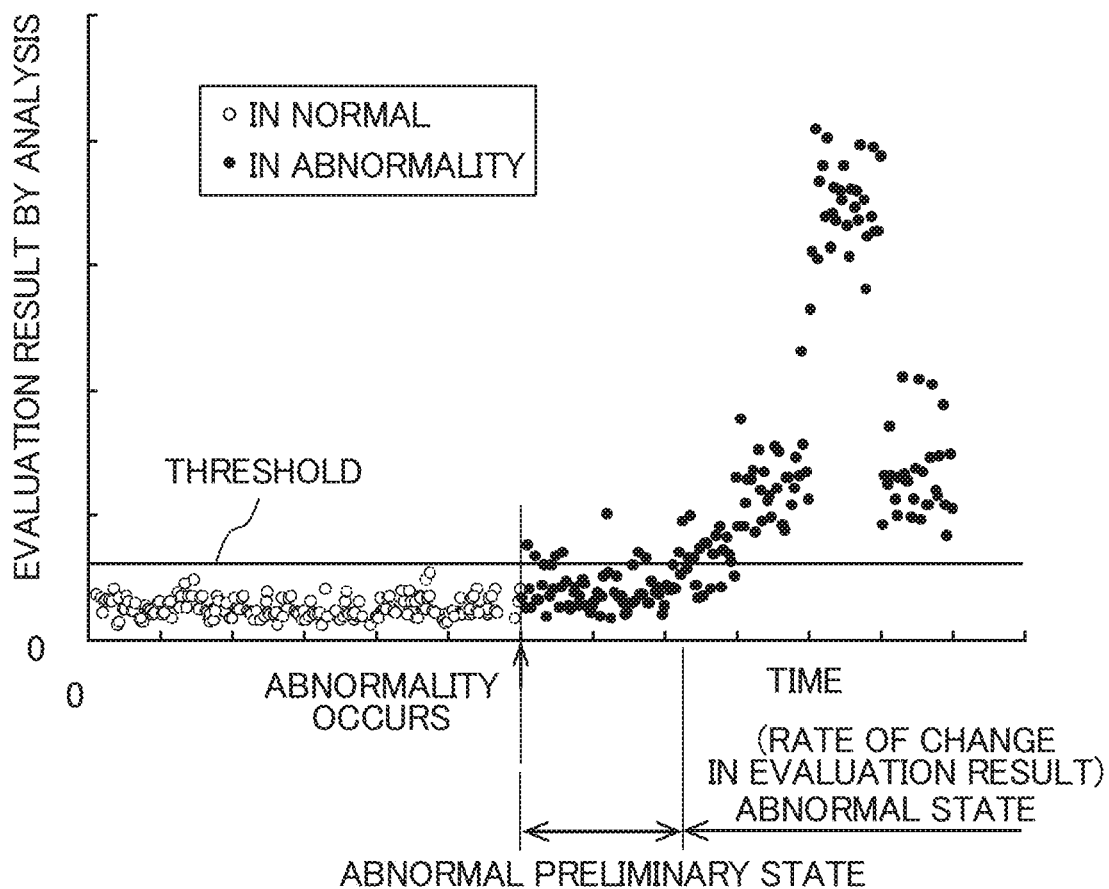
FIG. 6 is a drawing illustrating another example of determining abnormality from secular change in magnitude of observed acceleration.

FIG. 5 and FIG. 6 are drawings illustrating an example of determining abnormality from a secular change (horizontal axis) in an evaluation result (vertical axis) of the magnitude of observed acceleration. FIG. 5 and FIG. 6 illustrate an example of a screen that displays trend data based on a notification result given by the state estimator 5. Among the drawings, in FIG. 5, the evaluation result by analysis is sequentially plotted to be time-oriented and determined as abnormal when a predetermined threshold is exceeded.

In FIG. 6, a rate of change in the trend of the evaluation result is monitored. When the evaluation result gradually increases, this state is recognized as an abnormal preliminary state, and time intersecting with the threshold is roughly estimated by prediction and time when abnormality occurs is estimated, thus ensuring scheduled inspection. According to these method, abnormality, such as seizing, looseness of a bolt, and insufficient contact pressure, which have been conventionally overlooked, can be found by taking measures when the evaluation value or its changing rate exceeds a predetermined value or a predetermined range. Therefore, these methods are useful to avoid an accident in advance.

A further specific evaluation method using multivariate analysis method (for example, the Mahalanobis-Taguchi method and VQC) will be described as the internal process in the state estimator 5 based on the flowchart.

The internal process in the state estimator 5 is divided into a process in an advance preparation phase before diagnosis and a process in a diagnostic phase where various kinds of data are prepared and diagnosis is performed and executed.

Figure 7:
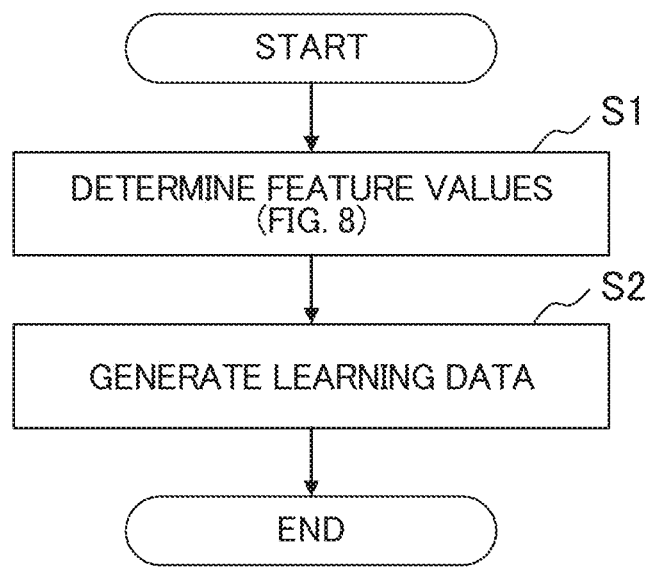
FIG. 7 is a drawing depicting processes in an advance preparation phase before diagnosis among internal processes in a state estimator 5.

FIG. 7 illustrates the processes in the advance preparation phase before diagnosis. The advance preparation phase before diagnosis generates the learning data database 6 in FIG. 1. The process here are processes of two phases, which are a process of determining feature values (process step S1) and a process of generating the learning data (process step S2). Among them, FIG. 8 depicts the detailed flowchart of the process step S1, which is the process of determining the feature values.

Figure 8:
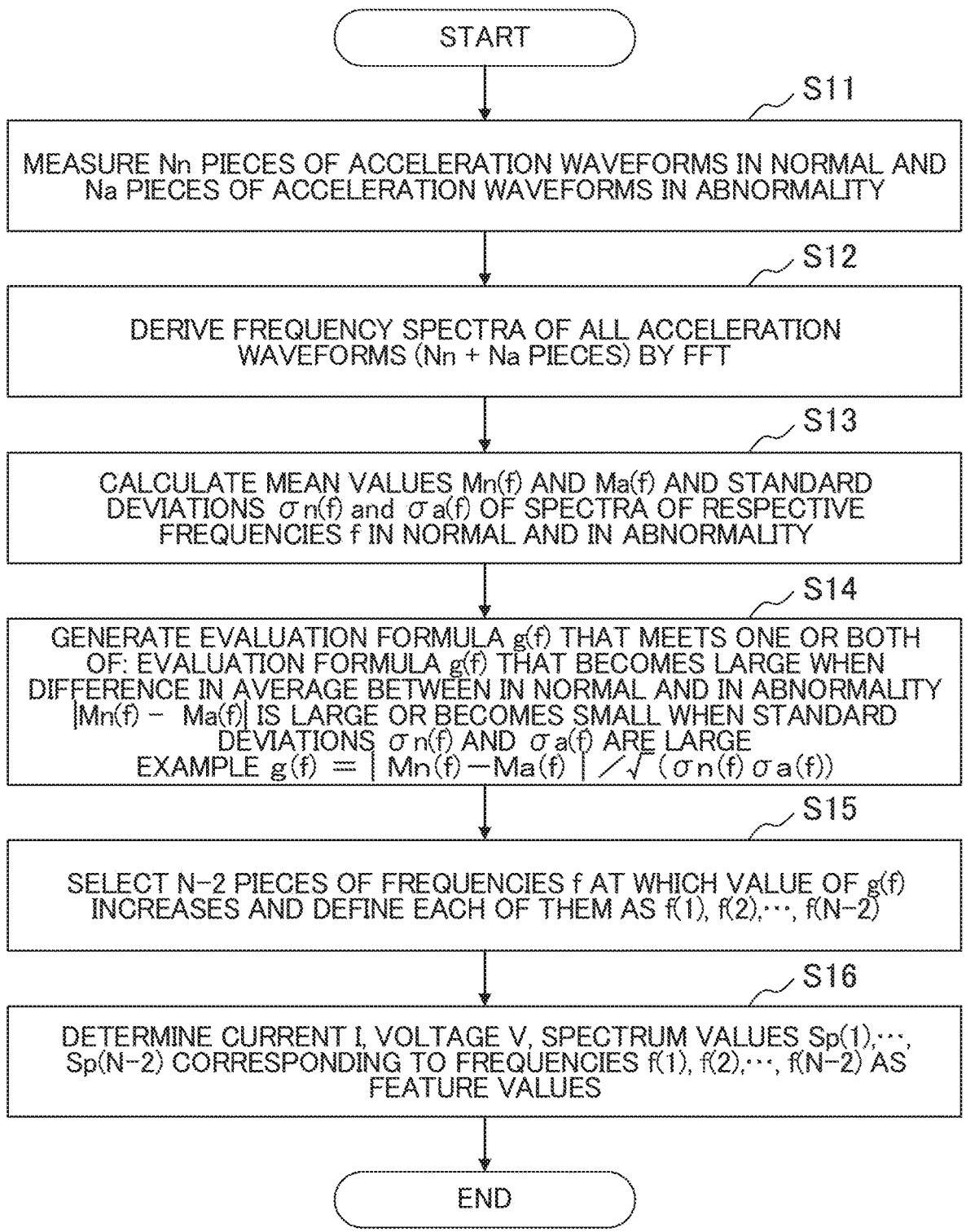
FIG. 8 is a detailed flowchart of a process step S1 as a process of determining feature values.

At the process step S11, which is the first process of determining the feature values (process step S1) depicted in FIG. 8, first, Nn pieces of the acceleration waveforms in normal and Na pieces of the acceleration waveforms in abnormality are measured by the acceleration sensor 10 mounted to the switchgear 1. Note that, the acceleration waveform when a switchgear for simulation is purposely operated as an abnormal state (abnormality, such as seizing, looseness of a bolt, and insufficient contact pressure) may be used as the acceleration waveform in abnormality, or the acceleration waveform in abnormality may be prepared from the already known information.

Next, in a process step S12, frequency spectra of all of the acceleration waveforms (Nn+Na pieces) are derived by FFT. As a result, a spectrum value for each discrete frequency is determined in each waveform of the acceleration waveforms (Nn+Na pieces). Note that it is conceivable that the spectrum waveform itself is used as the feature value. However, to obtain identification performance between abnormality and normal, a part related to state diagnosis needs to be extracted.

Figures 9, 10:
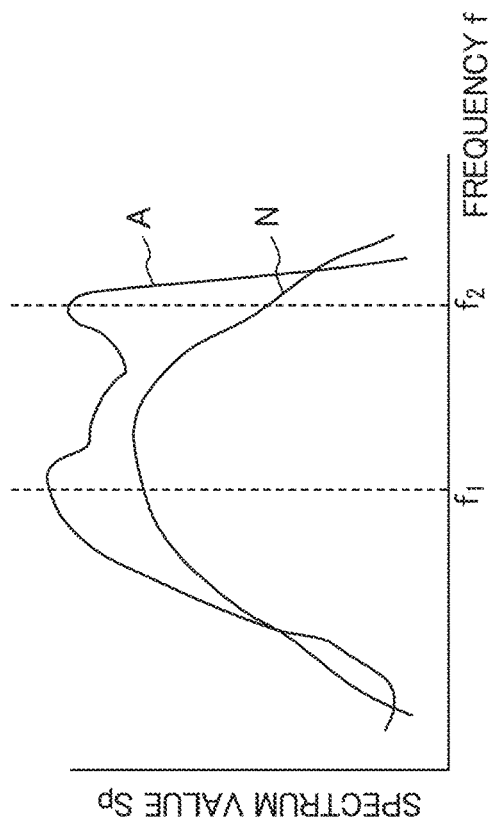
FIG. 9 is a drawing illustrating an example of results of frequency spectrum analysis of Nn pieces of acceleration waveforms in normal and Na pieces of acceleration waveforms in abnormality.
FIG. 10 is a drawing showing a learning data example generated in a process step S2.

FIG. 9 illustrates an example of results of frequency spectrum analysis of Nn pieces of the acceleration waveforms in normal and Na pieces of the acceleration waveforms in abnormality. In FIG. 9 plotting a frequency on the horizontal axis and a spectrum value on the vertical axis, while an analysis result of Nn pieces of the acceleration waveforms in normal exhibits a tendency like N, the analysis result of Na pieces of the acceleration waveforms in abnormality exhibits a tendency like A. According to the example of the results, since the two waveforms exhibit a large difference at a frequency f of $f_1$ and $f_2$, by grasping and monitoring the magnitudes at the frequencies $f_1$ and $f_2$ as the feature values, abnormality and normal are identifiable. Performing the following processes allows achieving the identification process.

Specifically, for example, next, in a process step S13, mean values Mn(f) and standard deviations σn(f) of a spectrum of the frequency f for Nn pieces of acceleration waveform groups in normal are calculated. Additionally, mean values Mn(f) and standard deviations σn(f) of a spectrum of the frequency f for Na pieces of acceleration waveform groups in abnormality are calculated.

At a process step S14, to determine the frequency corresponding to the spectrum value in which the abnormality and normal are easily identified, an evaluation formula g(f) that becomes large when a difference in average between in normal and in abnormality |Mn(f)–Ma(f)| is large and becomes small when the standard deviations σn (f) and σa. (f) are large is generated. It is conceivable that, for sensitive identification between abnormality and normal, the larger the difference in average is, the easier the identification is, and when the difference is small, the difference does not contribute to the identification. To reduce false detection, one with low variation is preferably employed. As the evaluation formula g(f), for example, the following Equation (1) is preferably employed.

[Math. 1]

$$g(f)=|Mn(f)-Ma(f)|/\sqrt{(\sigma n(f)\sigma a(f))} \quad (1)$$

At a process step S15, N–2 pieces of the frequencies f at which the value of the evaluation formula g(f) increases is selected, and each of them is defined as f(1), f(2), . . . , f(N–2).

Finally, in a process step S16, the current I, the voltage V, and spectrum values Sp(1), . . . , Sp(N–2) corresponding to the frequencies f(1), f(2), . . . , f(N–2) are determined as the feature values. This allows extracting one set of feature values from measurement data at certain time. As described above, the process of FIG. 8 allows determining the feature values.

Next, in a process step S2, the learning data illustrated in FIG. 10 is generated. The feature values constituting the learning data illustrated in FIG. 10 are a collection of a plurality of samples of spectrum values at the respective frequencies (f(1), f(2), . . . , f(N–2)) according to each combination of magnitudes of voltages and currents.

The learning data is generated by obtaining Nsm pieces (>N) of data in normal and extracting Nsm sets of feature values determined in the process step S1 of FIG. 7. As this learning data, a large number of various conditions that probably occur in normal are preferably obtained. Obtaining a variety of patterns of spectra that probably occur in normal, such as current change, voltage variation, and application of daily environmental noise, specifies an area that probably occurs in normal in an N-dimensional space generated by N pieces of feature values by the learning data.

Note that another method to determine the feature value of the spectrum is as follows. In this case, when the electric circuit of the load current flowing through the breaker and the cable is symmetrically arranged, an approximation is performed to examine what kind of acceleration appears by electromagnetic force caused by the load current.

Figure 11:
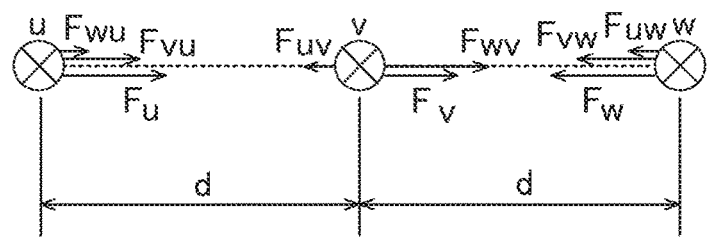
FIG. 11 is a drawing of calculation of acceleration of a parallel straight conductor when a three-phase alternating current is fed.

As illustrated in FIG. 11, assume that symmetric three-phase alternating currents $i_u$, $i_v$, and $i_w$ (direction back of the front of the paper is defined as positive) are fed to conductors of u, v, and w phases disposed parallel to apexes of an equilateral triangle with a length of one side of d. Each current in this case can be expressed by Equation (2).

[Math. 2]

$$i_u = \sqrt{2}\, I \cos\left(\omega t + \frac{2\pi}{3}\right),\ i_v = \sqrt{2}\, I \cos(\omega t),$$
$$i_w = \sqrt{2}\, I \cos\left(\omega t - \frac{2\pi}{3}\right) \quad (2)$$

Note that, here, I denotes an effective value of current (A), ω (=2πf) denotes an angular frequency (rad/s), and t denotes time (s). At this time, an acceleration $a_u$ of the conductor u and an acceleration $a_w$ of the conductor w are expressed by Equations (3) and (4), respectively.

[Math. 3]

$$a_u = \frac{F_u}{m} = \frac{\mu I^2}{\pi m d}\left(\frac{\sqrt{3}}{4}\sin(2\omega t) + \frac{3}{8}\right) \quad (3)$$

[Math. 4]

$$a_w = \frac{F_w}{m} = \frac{\mu I^2}{\pi m d}\left(\frac{\sqrt{3}}{4}\sin(2\omega t) - \frac{3}{8}\right) \quad (4)$$

With these equations, the accelerations of the conductors from the accelerations $a_w$ and $a_u$ are proportionate to a square of an effective value of the current in a horizontal direction. Additionally, the accelerations are periodic to ωt at a cycle π. That is, it is seen that the vibration occurs at a frequency twice a fundamental frequency.

As described above, it is found that generally a device coupled to a commercial frequency of 50 Hz is vibrated at 100 Hz and a device coupled to the commercial frequency of 60 Hz is vibrated at 120 Hz by electromagnetic force. In other words, selecting a harmonic to the commercial frequency as a monitoring target frequency is effective.

Figure 12:
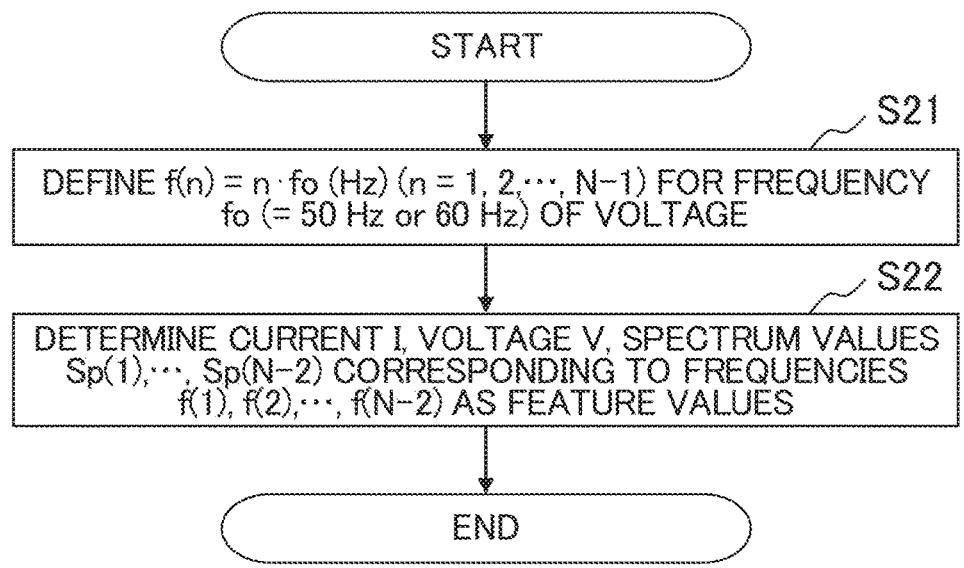
FIG. 12 is a drawing depicting a detailed procedure for another method of determining the feature value.

Based on the description above, FIG. 12 depicts a detailed procedure for another method of determining the feature value. First, in a process step S21, f(n)=n·fo (Hz) (n=1, 2, . . . , N–1) is defined to a frequency fo of an applied voltage. Next, in a process step S22, similarly as described above, the current I, the voltage V, and the spectrum values Sp(1), . . . , Sp(N–2) corresponding to the frequencies f(1), f(2), . . . , f(N–2) are determined as feature values. This method is effective in a case where data in abnormality cannot be obtained and is a simple method.

Next, among the internal processes in the state estimator 5, the process in the diagnostic phase where various kinds of data can be prepared and diagnosis is performed. FIG. 13 depicts processes in the diagnostic phase.

In the procedure during diagnosis of FIG. 13, first, in a process step S30, the acceleration vibration waveform is measured, subsequently its frequency spectrum is derived in a process step S31, and subsequently the above-described feature values are extracted in a process step S32. Finally, in a process step S33, the feature values are collated with the learning data illustrated in FIG. 10 by multivariate analysis method, such as the Mahalanobis-Taguchi method and VQC, and evaluation values for the extracted feature values are calculated.

The above-described method allows the regular evaluation of the state of the switchgear.

FIG. 6 described above illustrates the example of the results when the abnormality is simulated for experiment in the embodiment of the present invention, and therefore the identification results will be described with reference to the drawing. Note that, in FIG. 6, the white circles indicate the evaluation results in normal and the black circles indicate the evaluation results in abnormality.

While the evaluation results in normal became constant at low values, the evaluation results varied depending on a condition, such as the magnitude of the current I or presence/absence of the voltage V, in abnormality. Appropriately providing the threshold makes the abnormality detectable.

Note that the detection sensitivity and the false detection are in a trade-off relationship. Setting the threshold high reduces the false detection but results in poor sensitivity. Lowering the threshold increases the false detection but enhances the detection sensitivity. It is conceivable that, a method for determining the threshold to eliminate the false detection as many as possible includes, for example, the use of a straight line passing through the maximum evaluation value of the data measured in normal as the threshold, or the use of, for example, "mean value+3×standard deviation" as the threshold using a mean value and a standard deviation of the evaluation values in normal.

What is claimed is:

1. A diagnostic method of switchgear comprising:
   obtaining signals from an acceleration sensor mounted to a switchgear and a load current flowing through the switchgear;
   determining a frequency to be focused from a spectrum analysis result of the signals from the acceleration sensor in an advance preparation phase of diagnosis of the switchgear and generating learning data using at least the frequency and the load current as feature values; and
   regularly diagnosing a state of the switchgear from the feature values obtained during diagnosis and the learning data during the diagnosis of the switchgear,
   wherein in the advance preparation phase of diagnosis of the switchgear, a frequency at which values found by dividing, by standard deviations, a difference in mean values of a spectrum of the signals from the acceleration sensor in normal and in abnormality of the switchgear become large is selected as the frequency to be focused.

2. The diagnostic method of switchgear according to claim 1,
   wherein, in the advance preparation phase of diagnosis of the switchgear, an integral multiple of a frequency of a voltage applied to the switchgear is selected as the frequency to be focused.

3. The diagnostic method of switchgear according to claim 2,
   wherein the learning data is generated using the frequency, the load current, and a voltage applied to the switchgear as feature values.

4. The diagnostic method of switchgear according to claim 3,
   wherein the applied voltage to the switchgear is estimated from switching information of a power supply-side switch of the switchgear.

5. The diagnostic method of switchgear according to claim 1,
   wherein the learning data is generated using the frequency, the load current, and a voltage applied to the switchgear as feature values.

6. The diagnostic method of switchgear according to claim 5,
   wherein the applied voltage to the switchgear is estimated from switching information of a power supply-side switch of the switchgear.

7. A diagnostic device of switchgear, comprising:
   an input unit configured to obtain signals from an acceleration sensor mounted to a switchgear and a load current flowing through the switchgear;
   a learning data database configured to store learning data, the learning data being generated by determining a frequency to be focused from a spectrum analysis result of the signals from the acceleration sensor in an advance preparation phase of diagnosis of the switchgear and using at least the frequency and the load current as feature values; and
   a state estimator configured to regularly diagnose a state of the switchgear from the feature values obtained during diagnosis and the learning data during the diagnosis of the switchgear;
   wherein in the advance preparation phase of diagnosis of the switchgear, a frequency at which values found by dividing, by standard deviations, a difference in mean values of a spectrum of the signals from the acceleration sensor in normal and in abnormality of the switchgear become large is selected as the frequency to be focused.

* * * * *